United States Patent
Kobayashi et al.

(10) Patent No.: US 7,061,420 B2
(45) Date of Patent: Jun. 13, 2006

(54) GAIN CONTROL FOR ANALOG-DIGITAL CONVERTER

(75) Inventors: Shigeto Kobayashi, Gifu (JP); Kuniyuki Tani, Ogaki (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 149 days.

(21) Appl. No.: 11/072,297

(22) Filed: Mar. 7, 2005

(65) Prior Publication Data

US 2005/0219100 A1 Oct. 6, 2005

(30) Foreign Application Priority Data

Mar. 17, 2004 (JP) .............................. 2004-077285

(51) Int. Cl.
*H03M 1/12* (2006.01)

(52) U.S. Cl. ...................... 341/155; 341/110; 341/150; 341/172

(58) Field of Classification Search ................ 341/155, 341/156, 144, 145, 118, 120, 122, 110, 150, 341/172, 139
See application file for complete search history.

(56) References Cited

U.S. PATENT DOCUMENTS

| | | | | |
|---|---|---|---|---|
| 5,047,772 A | * | 9/1991 | Ribner | 341/156 |
| 5,159,342 A | * | 10/1992 | Yotsuyanagi | 341/161 |
| 6,097,326 A | * | 8/2000 | Opris et al. | 341/161 |
| 6,683,554 B2 | * | 1/2004 | Nikai et al. | 341/161 |
| 6,859,158 B2 | * | 2/2005 | Wada et al. | 341/155 |

FOREIGN PATENT DOCUMENTS

JP    04-026229    1/1992

* cited by examiner

*Primary Examiner*—John B Nguyen
(74) *Attorney, Agent, or Firm*—McDermott Will & Emery LLP

(57) ABSTRACT

A first amplifier circuit samples and amplifies an input analog signal by a gain of 0.8 and outputs the amplified signal to a first subtracter circuit. A first analog-digital converter circuit converts the input analog signal into a digital value so as to retrieve the higher 4 bits. A first digital-analog converter circuit converts the digital value produced by conversion by the first analog-digital converter circuit into an analog value. The first subtracter circuit subtracts an output analog signal from the first digital-analog converter circuit from an output analog signal from the first amplifier circuit. The output analog signal from the first digital-analog converter circuit is amplified by a gain of 0.8. By setting the gain of the first amplifier circuit to be below 1, an input voltage range is extended.

20 Claims, 9 Drawing Sheets

FIG.4

| | GAIN OF 1 | | | | | GAIN OF 0.8 | | | |
|---|---|---|---|---|---|---|---|---|---|
| | POSITIVE END | | NEGATIVE END | | | POSITIVE END | | NEGATIVE END | |
| | VRT | VRB | VRT | VRB | | VRT | VRB | VRT | VRB |
| A | 8 | 0 | 0 | 8 | A | 9 | 1 | 1 | 9 |
| B | 7 | 1 | 1 | 7 | B | 8 | 2 | 2 | 8 |
| C | 6 | 2 | 2 | 6 | C | 7 | 3 | 3 | 7 |
| D | 5 | 3 | 3 | 5 | D | 6 | 4 | 4 | 6 |
| E | 4 | 4 | 4 | 4 | E | 5 | 5 | 5 | 5 |
| F | 3 | 5 | 5 | 3 | F | 4 | 6 | 6 | 4 |
| G | 2 | 6 | 6 | 2 | G | 3 | 7 | 7 | 3 |
| H | 1 | 7 | 7 | 1 | H | 2 | 8 | 8 | 2 |
| I | 0 | 8 | 8 | 0 | I | 1 | 9 | 9 | 1 |

GAIN CONTROL FOR ANALOG-DIGITAL CONVERTER

BACKGROUND OF THE INVENTION

1. Field of the Invention

The present invention relates to an analog-digital converter and, more specifically, to an analog-digital converter of a pipeline type or a cyclic type.

2. Description of the Related Art

In recent years, a variety of additional functions are built in mobile appliances such as a mobile telephone set, including the image pick-up function, the image playback function, the moving image pick-up function and the moving image playback function. In association with this, there is an increasing demand for miniaturization and power saving of an analog-digital converter (hereinafter, referred to as an AD converter). One mode of AD converter that addresses this demand is known as a cyclic AD converter that cycles through stages (see, for example, the Related art list No. 1). The Related art list No. 1 discloses an AD converter of a pipeline type comprising two stages that includes a cyclic conversion part.

Related Art List

1. Japanese Published Patent Application No. 4-26229

The first stage of the AD converter illustrated in FIG. 1 of the Related art list No. 1 is provided with the sample and hold circuit S/H1 parallel with a system comprising the parallel A/D converter AD1 and the DA converter DA1. An analog signal input to this circuit is held by the sample and hold circuit S/H1 for a predetermined period of time.

Since the sample and hold circuit includes an operational amplifier, the output voltage range of the sample and hold circuit may be limited in a low voltage operation. Degradation in characteristics, such as distortion, caused by less extensive output voltage range of the sample and hold circuit in a low voltage operation presents a serious disadvantage particularly in the first stage with the severest requirement for precision. As a result, the characteristics of the AD converter as a whole become poor.

SUMMARY OF THE INVENTION

The present invention has been done in view of the aforementioned circumstances and its object is to improve the low-voltage characteristics of an AD converter that converts from an analog signal into a digital value in a plurality of discrete steps.

The present invention according to one aspect provides an analog-digital converter. The analog-digital converter according to this aspect comprises a basic unit for each of the converter's stages, said basic unit comprising: an analog-digital converter circuit converting an analog signal input to the unit's stage into a digital value of a predetermined number of bits; a digital-analog converter circuit converting an output from the analog-digital converter into an analog signal; a subtracter circuit subtracting an output from the digital-analog circuit from the analog signal input to the unit's stage or from an output analog signal from an amplifier amplifying the analog signal input to the unit's stage by a predetermined gain, wherein a target digital signal from the analog-digital converter is obtained by using the basic unit once or in repeated sequences, and the gain of at least one amplifier circuit included in the analog-digital converter is set to be below 1.

Arbitrary combinations of the aforementioned constituting elements, and implementations of the invention in the form of methods, apparatus and systems may also be practiced as additional modes of the present invention.

BRIEF DESCRIPTION OF THE DRAWINGS

FIG. 4 lists the combinations of higher reference voltages VRT and lower reference voltages VRB input to a capacitor array.

DETAILED DESCRIPTION OF THE INVENTION

Figure 1:
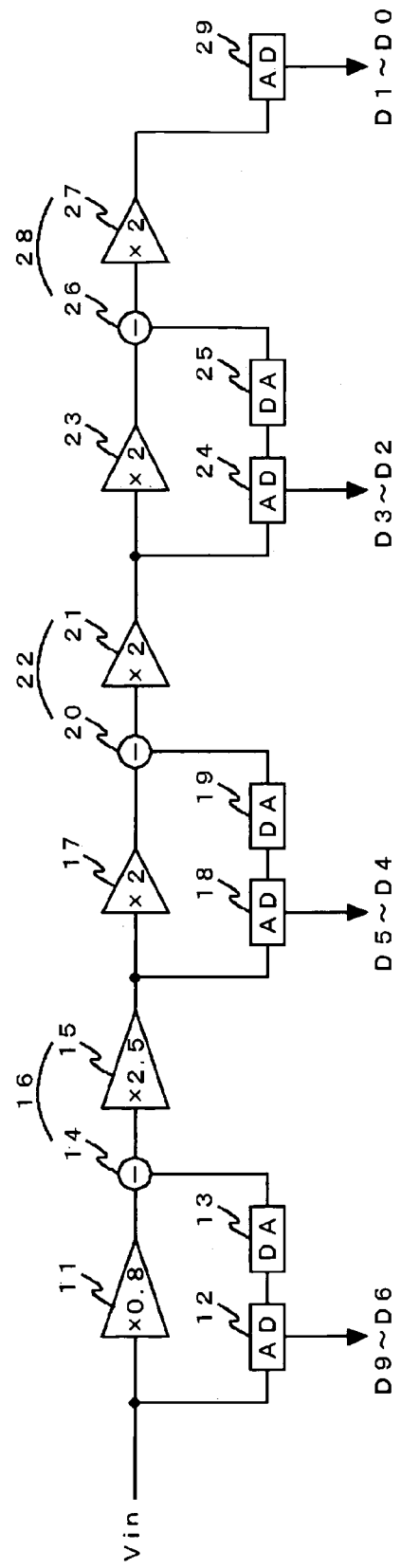
FIG. 1 illustrates the structure of an AD converter according to a first embodiment of the present invention.

Representative aspects of the present invention will be described.

The present invention according to one aspect provides an analog-digital converter. The analog-digital converter according to this aspect comprises a basic unit for each of the converter's stages, said basic unit comprising: an analog-digital converter circuit converting an analog signal input to the unit's stage into a digital value of a predetermined number of bits; a digital-analog converter circuit converting an output from the analog-digital converter into an analog signal; a subtracter circuit subtracting an output from the digital-analog circuit from the analog signal input to the unit's stage or from an output analog signal from an amplifier amplifying the analog signal input to the unit's stage by a predetermined gain, wherein a target digital signal from the analog-digital converter is obtained by using the basic unit once or in repeated sequences, and the gain of at least one amplifier circuit included in the analog-digital converter is set to be below 1.

Providing an amplifier circuit with a gain of below 1 according to this aspect results in the converter including an amplifier circuit in which an input voltage range is extended. Accordingly, the characteristics of the AD converter as a whole are improved. The term "amplifier circuit" also refers to a circuit for amplification by a gain of 1, i.e. a sample and hold circuit.

The present invention according to another aspect also provides an analog-digital converter. The analog-digital converter according to this aspect converts an input analog signal into a digital signal in a plurality of discrete steps and comprises a stage which comprises: an amplifier circuit amplifying an analog signal input to the amplifier's stage by a gain below 1; an analog-digital converter circuit parallel with the amplifier circuit to receive the analog signal and convert a component of the analog signal into a digital value of a predetermined number of bits; a digital-analog converter circuit converting an output from the analog-digital circuit into an analog signal; and a subtracter circuit subtracting an output from the digital-analog circuit from an output from the amplifier circuit.

According to this aspect, by providing an amplifier circuit amplifying by a gain below 1 in place of the related-art sample and hold circuit, degradation in characteristics, occurring in the sample and hold circuit in a low-voltage operation according to the related art, is eliminated. Accordingly, the characteristics of the AD converter as a whole are improved. Since the amplifier circuit amplifies by a gain below 1, the input voltage range is extended.

The amplifier circuit amplifying by a gain below 1 may be an amplifier circuit which first receives the analog signal input to the analog-digital converter. The signal input to the amplifier in this case is the largest signal and is liable to distortion. By ensuring that the gain of the amplifier circuit is below 1, the characteristics are improved.

The analog-digital converter according to this aspect may include a feedback stage which feeds an output analog signal from the feedback stage back to an input of the feedback stage. With this, the characteristics of the AD converter including the feedback stage are improved.

The DA converter circuit may amplify by a gain practically identical with the gain of a corresponding amplifier circuit before outputting an analog signal from conversion. With this, the output from the AD converter circuit is amplified by the DA converter circuit in association with the gain of the amplifier circuit. The DA converter circuit is configured to include a capacitor array. The number of capacitors may be adjusted in accordance with the gain to be achieves. By setting the gain below 1 by increasing the number of capacitors, desired amplification is achieved without changing the level of the reference voltage in the AD converter circuit and in the DA converter circuit. Accordingly, the level of the reference voltage is stabilized so that high-precision amplification is achieved.

The present invention according to still another aspect also provides an analog-digital converter. The analog-digital converter according to this aspect further comprises a gain control circuit controlling the gain of the amplifier circuit which receives the analog signal input to the circuit's stage and the gain of the DA converter circuit in the same stage. When a difference between an output from the amplifier circuit and an output from the DA converter circuit is amplified by a predetermined gain and fed back to the amplifier circuit and the AD converter circuit, the gain control circuit sets the gain of the amplifier circuit and the gain of the DA converter circuit to be 1 or larger. The signal fed back to the amplifier signal is a difference signal smaller than the signal previously input. Therefore, the signal is less liable to distortion in the amplifier circuit. By ensuring that the amplifier circuit amplifiers an initially input signal by a gain below 1 and amplifies a signal input for second and subsequent steps by a gain of 1 or larger, both the requirement for improved characteristics and the requirement for increased speed are met.

The present invention according to yet another aspect also provides an analog-digital converter. The analog-digital converter according to this aspect further comprises: a signal level determination circuit determining the level of an analog signal input to an amplifier circuit which receives an analog signal input to the signal level determination circuit's stage; and a gain control circuit setting the gain of the amplifier circuit and the gain of the DA converter circuit of the same stage to be 1 or larger, when the signal level determination circuit determines that the analog signal is equal to or below a predetermined threshold level. With this, by ensuring that a signal at a level that causes distortion in the amplifier circuit is amplified by a gain below 1, and a signal at a level that does not cause distortion is amplified by a gain of 1 or larger, both the requirement for improved characteristics and the requirement for increased speed are met. The "predetermined threshold value" is determined based on the output voltage range of an amplifier.

First Embodiment

The first embodiments provides an AD converter of a pipeline type comprising four stages in which an AD converter circuit in the first stage converts into 4 bits and each of AD converter circuits in the second through fourth stages converts into 2 bits.

FIG. 1 illustrates the structure of an AD converter according to the first embodiment. In this AD converter, an input analog signal Vin is fed to a first amplifier circuit 11 and a first AD converter circuit 12. The first amplifier circuit 11 samples the input analog signal Vin, amplifies the same by a gain of 0.8 and outputs the amplified signal to a first subtracter circuit 14. The first AD converter circuit 12 converts the input analog signal Vin into a digital value so as to retrieve the higher 4 bits (D9–D6). The first amplifier circuit 11 and first AD converter circuit 12 sample the input analog signal Vin according to the same timing schedule. The first DA converter circuit 13 converts the digital value produced by conversion by the first AD converter circuit 12 into an analog value. The first subtracter circuit 14 subtracts an output analog signal from the first DA converter circuit 13 from an output analog signal from the first amplifier circuit 11. The output analog signal from the first DA converter circuit 13 is amplified by a gain of 0.8. A detailed description of the structure to achieve this will be given later. A second amplifier circuit 15 amplifies an output analog signal from the first subtracter circuit 14 by a gain of 2.5. A first subtracting amplifier circuit 16 of an integral type may be used instead of the first subtracter circuit 14 and the second amplifier circuit 15. In this way, the circuit area is reduced.

An output analog signal from the second amplifier circuit 15 is fed to a third amplifier circuit 17 and a second AD converter circuit 18. The third amplifier circuit 17 amplifies the input analog signal by a gain of 2 and outputs the amplified signal to a second subtracter circuit 20. A second AD converter circuit 18 converts the input analog signal into a digital value and retrieves the 5th through 6th highest bits (D5–D4).

Since the second stage is tasked with converting into 2 bits, the output from the first stage should practically be amplified by a gain of 4 (2 raised to the 2nd power). In the first stage, amplification by a gain of 2 is achieved by amplification by the first amplifier circuit 11 by a gain of 0.8 and amplification by the second amplifier circuit 15 by a gain of 2.5. In addition to this, the reference voltage for the voltage comparators in the second AD converter circuit 18 is set to be ½ that of the first AD converter circuit 12, thereby achieving the aforementioned amplification by a gain of 4.

A second DA converter circuit 19 converts the digital value produced by conversion by the second AD converter circuit 18 into an analog value. The second subtracter circuit 20 subtracts the output analog signal from the second DA converter circuit 19 from the output analog signal from the third amplifier circuit 17. The output analog signal from the second DA converter circuit 19 is amplified by a gain of 2. A fourth amplifier circuit 21 amplifies an output analog signal from the second subtracter circuit 20 by a gain of 2. A second subtracting amplifier circuit 22 of an integral type may be used instead of the second subtracter circuit 20 and the fourth amplifier circuit 21.

The output analog signal from the fourth amplifier circuit 21 is fed to a fifth amplifier circuit 23 and a third AD converter circuit 24. The fifth amplifier circuit 23 amplifies the input analog signal by a gain of 2 and outputs the amplified signal to a third subtracter circuit 26. The third AD converter circuit 24 converts the input analog signal into a digital value and retrieve the 7th through 8th highest bits (D3–D2).

A third DA converter circuit 25 converts the digital value produced by conversion by the third AD converter circuit 24 into an analog value. The third subtracter circuit 26 subtracts an output analog signal from the third DA converter circuit 25 from an output analog signal from the fifth amplifier circuit 23. The output from the third DA converter circuit 25 is amplified by a gain of 2. A sixth amplifier circuit 27 amplifies an output analog signal from the third subtracter circuit 26 by a factor of 2. A third subtracting amplifier circuit 28 of an integral type may be used instead of the third subtracter circuit 26 and the sixth amplifier circuit 27.

An output analog signal from the sixth amplifier circuit 27 is fed to a fourth AD converter circuit 29. The fourth AD converter circuit 29 converts the input analog signal into a digital value so as to retrieve the 9th through 10th highest bits (D1–D0). With this, a 10-bit digital value is obtained using four stages. By setting the reference voltage for the voltage comparators in the first AD converter circuit 12 to be 2.5 times that of the second AD converter circuit 18, the gain of the second amplifier circuit 15 can be set to 2.

Figure 2:
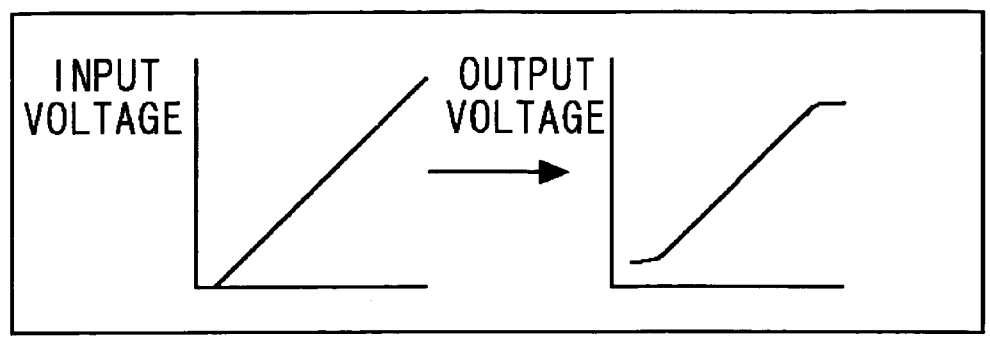
FIG. 2 is a graph showing the input voltage vs. output voltage characteristic occurring when the output voltage range of an amplifier circuit using an operational amplifier is not sufficiently extensive.

FIG. 2 is a graph showing the input voltage vs. output voltage characteristic occurring when the output voltage range of an amplifier circuit using an operational amplifier is not sufficiently extensive. An output voltage as illustrated in FIG. 2 is inherent in the operational amplifier. There is a zone in which the linearity of the output voltage with respect to the input voltage cannot be ensured unless the output voltage range sufficiently extensive is ensured. That is, the output voltage suffers distortion in a high output voltage zone and in a low output voltage zone. In contrast, the output voltage in the central zone does not suffer from distortion.

In the AD converter circuit illustrated in FIG. 1, the amplifier receiving the largest signal is the first amplifier circuit 11 which receives the input analog signal Vin. The other amplifier circuits 15, 17, 21, 23 and 27 receive a signal subjected to at least one step of subtraction, i.e. receive a signal smaller than that of the first amplifier circuit 11. Therefore, the amplifier circuit most affected by the narrowing of output voltage range due to a low power supply voltage is the first amplifier circuit 11. Also, the amplifier circuit with the severest requirement for precision in the AD converter is the first amplifier circuit 11. Therefore, the gain of the first amplifier circuit 11 is set to be below 1 so that distortion is not generated in the output analog signal from the first amplifier circuit 11.

Figure 3:
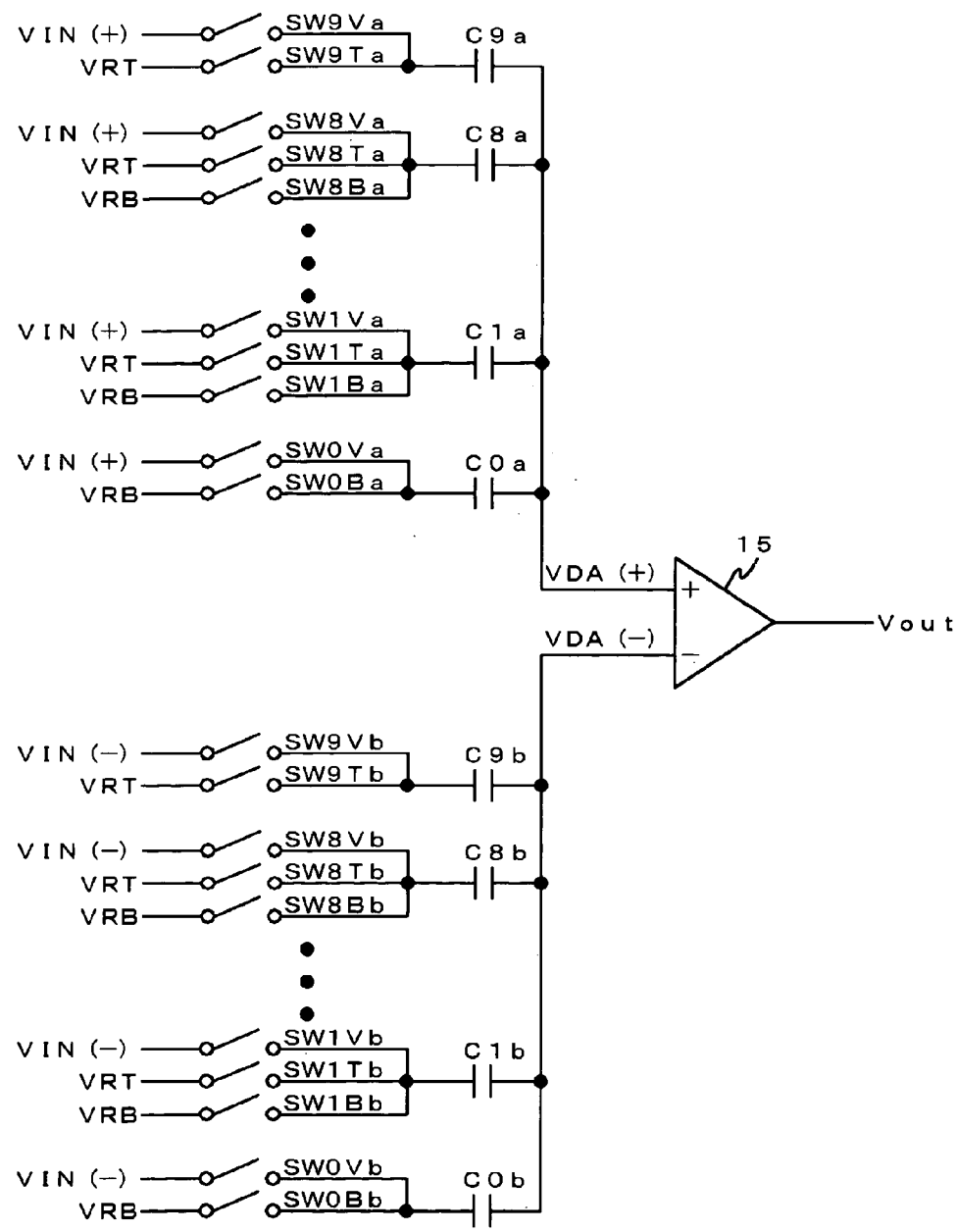
FIG. 3 illustrates the circuit structure of a first DA converter circuit, a first subtracter circuit and a second amplifier circuit.

A description will be given of a method of allowing the first DA converter circuit 13 to amplify the output from the first AD converter circuit 12 practically by a gain of 0.8. FIG. 3 illustrates the circuit structure of the first DA converter circuit 13, the first subtracter circuit 14 and the second amplifier circuit 15. The first AD converter circuit 12 preceding the first DA converter circuit 13 is of a flash type capable of parallel comparison. An AD converter circuit of a flash type converting into 4 bits requires 16 voltage comparators.

The first DA converter circuit 13 is configured to include a capacitor array with a differential input. The DA converter circuit 13 is provided with 10 capacitors C0a–C9a on the positive end and 10 capacitors C0b–C9b on the negative end. The positive-end capacitors C0a–C9a and the negative-end capacitors C0b–C9b all have the identical capacitance c. On the positive end, 10 Vin switches SW0Va–SW9Va, 9 VRT switches SW1Ta–SW9Ta and 9 VRB switches SW0Ba–SW8Ba are provided. The positive-end capacitors C1a–C8a are connected to the three kinds switches mentioned above so as to selectively receive the input analog signal Vin (+), a higher reference voltage VRT and a lower reference voltage VRB. The capacitor C0a is only connected to the Vin switch SW0Va and the VRB switch SW0Ba so as to selectively receive the input analog signal Vin (+) and the lower reference voltage VRB. The capacitor C9a is connected to the Vin switch SW0Va and the VRT switch SW9Ta so as to selectively receive the input analog signal Vin (+) and the higher reference voltage VRT. Outputs from the 10 capacitors C0a–C9a on the positive end are fed to the non-inverting input of the second amplifier circuit 15. The negative end is similarly constructed such that outputs from the 10 capacitors C0b–C9b are fed to the inverting input terminal of the second amplifier circuit 15.

Each of 8 comparators (not shown) of the first AD converter circuit 12 compares a corresponding one of reference potentials with a regular step size with the input analog signal Vin so as to output a signal of high or a signal of low. The outputs are converted into a binary code forming the digital value. The outputs are also used to effect on/off control of the 8 pairs constituted by the positive-end VRT switches SW1Ta–SW8Ta and the VRB switches SW1Ba–SW8Ba. Similarly, the outputs are also used to effect on/off control of the 8 pairs on the negative end. More specifically, when the output from the voltage comparator at the lowest end of the range is high, the corresponding VRT switch SW1Ta on the positive end is turned on, the corresponding VRB switch SW1Ba on the positive end is turned off, the corresponding VRT switch SW1Tb on the negative end is turned off and the corresponding VRB switch SW1Bb on the negative end is turned on. Switches corresponding to the other voltage comparators are similarly turned on and off.

A description will now be given of the operation of the AD converter. In a proper operation, all of the Vin switches SW1Va–SW8Va and SW1Vb–SW8Vb are initially turned on so that the capacitors C0a–C9a and C0b–C9b are charged by the input analog signal Vin. Subsequently, the VRT switches SW1Ta–SW8Ta and SW1Tb–SW8Tb, and the VRB switches SW1Ba–SWBBa and SW1Bb–Sw8Bb coupled to the respective capacitors are selectively turned on and off so as to charge the capacitors C0a–C9a and C0b–C9b by the digital value produced by conversion by the first AD converter circuit 12. With this, the function of the first subtracter circuit 14 is implemented.

For simplified description, only the operation for amplifying the output from the first AD converter circuit 12 by a gain of 0.8 will be described. It is assumed that the charge stored in each of the 10 capacitors on the positive end and on the negative end is 0. Subsequently, a combination of the high and low signals from the 8 voltage comparators determines a combination of the higher reference voltages VRT and the lower reference voltages VRB input to the capacitors C0a–C9a and C0b–C9b.

FIG. 4 lists the combinations of higher reference voltages VRT and lower reference voltages VRB input to the capacitor array of the first DA converter circuit 13. The left half of FIG. 4 relates to a case where 8 capacitors generically referred to as C1–C8 are provided on the positive end and the negative end, for the 8 voltage comparators, i.e. an ordinary case where the output from the first AD converter circuit 12 is not amplified. The right half of FIG. 4 relates to the structure of FIG. 3 where the 10 capacitors generically referred to as C0–C9 are provided on the positive end and the negative end, for the 8 voltage comparators, i.e. a case where the output from the first AD converter circuit 12 is amplified by a gain of 0.8. A total of 9 combinations, A–I, of the reference voltages are possible in response to the outputs from 8 voltage comparators, as listed in the left half of the figure. More specifically, referring to the left half, the combinations range from a combination of 8:0 on the positive end and 0:8 on the negative end, to a combination of 0:8 on the positive end and 8:0 on the negative end, where the numeral on the left side of the proportional expression indicates the number of voltages VRT occurring at the input of the capacitor array and the numeral on the right side indicates the number of voltages VRB. In contrast, in the structure of FIG. 3, the capacitors C9a and C9b which constantly receive the higher reference voltage VRT are provided on the positive end and the negative end, respectively. Similarly, the capacitors C0a and C0b which constantly receive the lower reference voltage VRB are provided on the positive end and the negative end, respectively. As a result of this, the combinations of the reference voltages responsive to the outputs from the 8 voltage comparators range from a combination of 9:1 on the positive end and 1:9 on the negative end, to a combination of 1:9 on the positive end and 9:1 on the negative end.

In the ordinary case of amplification by a gain of 1.0 indicated in the left half, 8 capacitors C1a–C8a are provided on the positive end so that a charge Q1 stored in the capacitors C1a–C8a is given by the following equation (A1). Similarly, a charge Q2 stored in 8 capacitors C1b–C8b on the negative end is given by the following equation (A2).

$$Q1 = n\{VRT - VDA(+)\}c + (8-n)\{VRB - VDA(+)\}c \quad (A1)$$

$$Q2 = (8-n)\{VRT - VDA(-)\}c + n\{VRB - VDA(-)\}c \quad (A2)$$

where n indicates the number of voltages VRT and (8−n) indicates the number of voltages VRB.

Since our assumption is that the charge is 0 at the initial condition, the principle of conservation of charge demands that an analog signal VDA (+) be given by the following equation (A3). Similarly, an analog signal VDA (−) is given by the following equation (A4).

$$VDA(+) = VRB + n(VRT - VRB)/8 \quad (A3)$$

$$VDA(-) = VRB + n(VRT - VRB)/8 \quad (A4)$$

Accordingly, an analog signal VDA is given by the following equation (A5).

$$VDA = VDA(+) - VDA(-) = VRB - VRT + 2n(VRT - VRB)/8 \quad (A5)$$

In contrast, in the case of amplification by a gain of 0.8 indicated in the right half, the 10 capacitors C0a–C9a are provided on the positive end so that a charge Q3 stored in the capacitors C0a–C9a is given by the equation (A6). Similarly, a charge Q4 stored in the 10 capacitors C0b–C9b on the negative end is given by the following equation (A7).

$$Q3 = (n+1)\{VRT - VDA(+)\}c + (10-n)\{VRB - VDA(+)\}c \quad (A6)$$

$$Q4 = (10-n)\{VRT - VDA(-)\}c + (n+1)\{VRB - VDA(+)\}c \quad (A6)$$

where n indicates the number of voltages VRT and (10−n) indicates the number of voltages VRB.

Applying an expansion of the equation similar to that of the case of a gain of 1.0, the analog signal VDA is given by the following equation (A8).

$$VDA = VRB - VRT + 2(n+1)\{VRT - VRB\}/10 \quad (A8)$$

The following relationship holds between the equation (A5) and the equation (A8).

$$[VRB - VRT + 2n(VRT - VRB)/8]*0.8 = VRB - VRT + 2(n+1)\{VRT - VRB\}/10$$

Thus, by providing the capacitors, generically referred to as C0 and C9, both on the positive end and the negative end, in addition to the circuit structure for amplification by a gain of 1.0, and by feeding the lower reference voltage VRB to one of the capacitors C0 and C9 and feeding the higher reference voltage VRT to the other of the capacitors C0 and C9, the output from the first AD converter circuit 12 can be amplified by a gain of 0.8.

The number of capacitors added and the capacitance thereof is not limited to those described. By controlling those parameters, a variety of gain values are achieved. The requirement in this case is that the total number of voltages input to the positive end and that of the negative end are identical. The above-described approach is applicable not only to the arrangement of 8 voltage comparators but also to other arrangements including other numbers of voltage comparators. That is, the above-described approach is also applicable to AD converter circuits other than that of 4-bit output.

Figure 5:
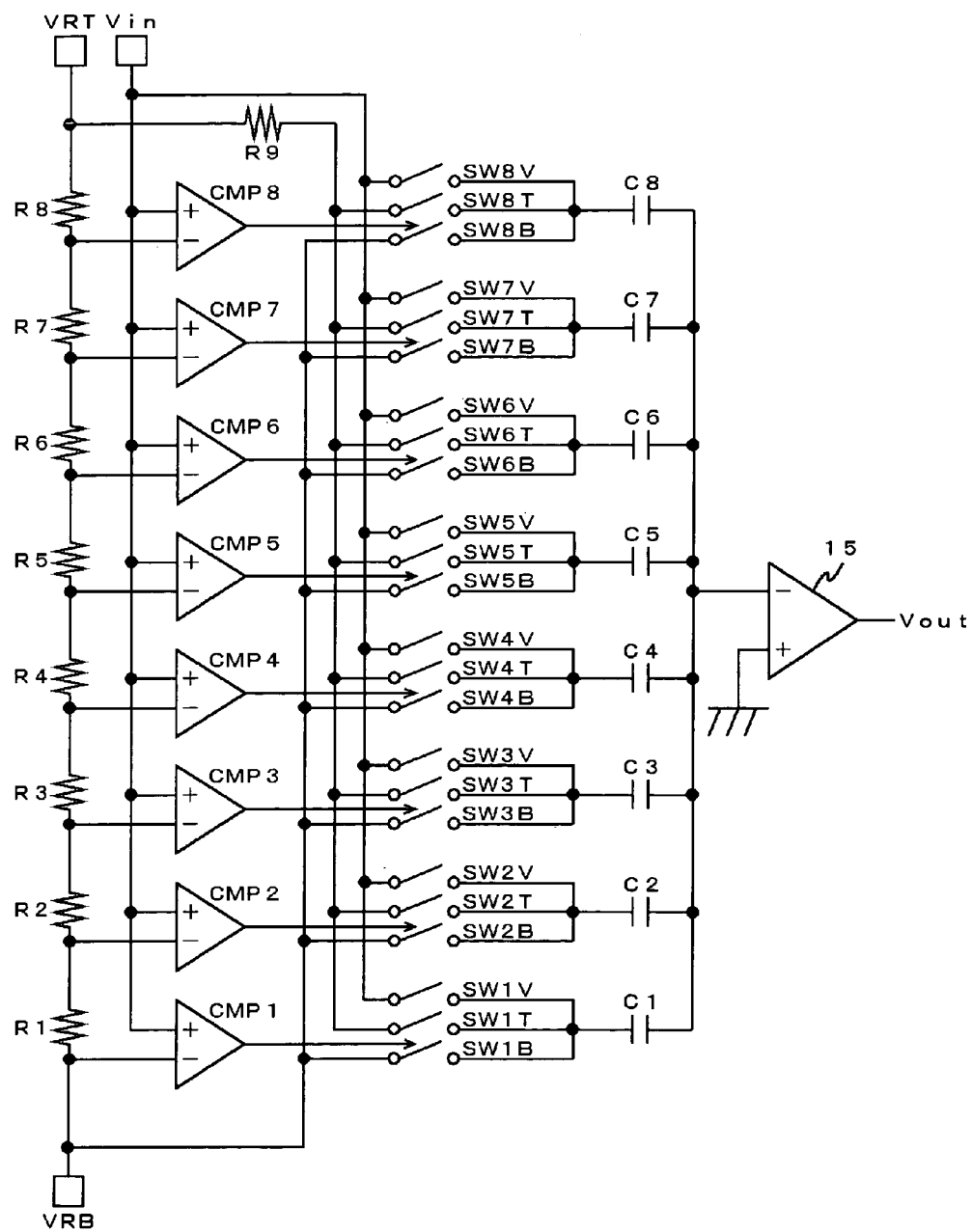
FIG. 5 illustrates a variation of the circuit structure of a first AD converter circuit, a first DA converter circuit, a first subtracter circuit and a second amplifier circuit.

A description will now be given of another method of ensuring that the output from the first AD converter circuit 12 is practically amplified by a gain of 0.8 by the first DA converter circuit 13. FIG. 5 illustrates a variation of the circuit structure of the first AD converter circuit 12, the first DA converter circuit 13, the first subtracter circuit 14 and the second amplifier circuit 15. The first AD converter circuit 12 is of a flash type capable of parallel comparison. An AD converter circuit of a flash type converting into 4 bits requires 16 voltage comparators. For convenience, the following description assumes a case where 8 voltage comparators are used. The first AD converter circuit 12 is provided with 8 resistors R1–R8 and 8 voltage comparators CMP1–CMP8. Outputs from the voltage comparators CMP1–CMP8 are fed to the first DA converter circuit 13 and an encoder (not shown).

The resistors R1–R8 are connected in series between the higher reference voltage VRT and the lower reference voltage VRB. The resistors R1–R8 are of the same resistance and produce reference potentials with a regular step size. The reference potentials are fed to the inverting input terminals of the voltage comparators CMP1–CMP8. The analog signal Vin is fed to the non-inverting input terminals of the voltage comparators CMP1–CMP8. Each of the voltage comparators CMP1–CMP8 outputs a high-level signal when the analog signal Vin is higher than the reference potential and outputs a low-level signal when the analog signal Vin is lower than the reference potential.

The first DA converter circuit 13 is configured to include a capacitor array with a single input. The first DA converter circuit 13 is provided with 8 Vin switches SW1V–SW8V, 8 VRT switches SW1T–SW8T, 8 VRB switches SW1B–SW8B and 8 capacitors C1–C8 connected in an array. The first DA converter circuit 13 is supplied with a voltage derived from stepping down the higher reference voltage VRT by a resistor R9. The operation of the first DA converter circuit 13 is the same as the operation for amplification by a gain of 1.0 described with reference to FIG. 3 and FIG. 4.

The reference voltage range {VRT-(voltage drop by the resistor R9)-VRB} is set to be 0.8 times the reference voltage range (VRT–VRB) supplied to the first AD converter circuit 12. The resistance of the resistor R9 for stepping down the higher reference voltage VRT for supply to the first DA converter circuit 13 is set to meet the above-described relationship. By controlling the resistance, gains other than 0.8 may also be achieved. When the first DA converter circuit 13 is configured as a differential input circuit, the reference voltage range supplied to the first DA converter circuit 13 is double the reference voltage range supplied to the first AD converter circuit 12, given that the resistor R9 is not connected. In this case, the resistance of the resistor R9 is set accordingly.

Second Embodiment

This embodiment provides an AD converter in which the AD converter circuit in a first stage converts into 4 bits and the AD converter circuit of a cyclic type in a second stage converts into 2 bits in each of 2 cycles, thus outputting a total of 10 bits.

Figure 6:
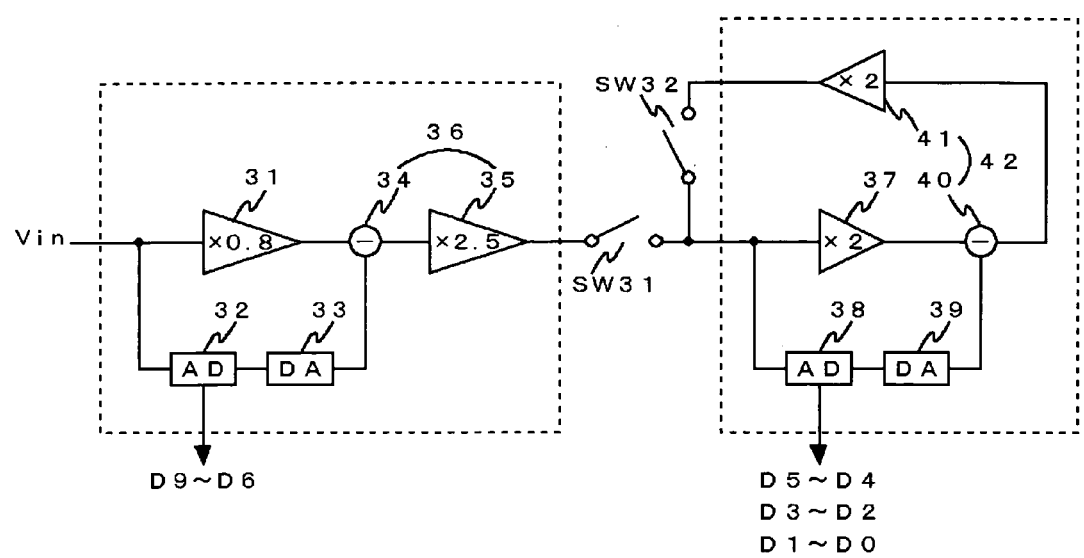
FIG. 6 illustrates the structure of an AD converter according to a second embodiment of the present invention.

FIG. 6 illustrates the structure of an AD converter according to the second embodiment. A description will be given of the preceding stage of the AD converter. The input analog signal Vin is fed to a first amplifier circuit 31 and a first AD converter circuit 32. The first AD converter circuit 32 is of a flash type and the resolution thereof, i.e. the number of bits produced by conversion thereby, is 4 bits. The first AD converter circuit 32 converts the input analog signal into a digital value, retrieves the higher 4 bits (D9–D6) and outputs the bits to the encoder (not shown) and a first DA converter circuit 33. The first DA converter circuit 33 converts the digital value produced by conversion by the first AD converter circuit 32 into an analog value. The first amplifier circuit 31 samples the input analog signal and amplifies the sampled signal by a gain of 0.8 and outputs the amplified signal to a first subtracter circuit 34. The first subtracter circuit 34 subtracts an output from the first DA converter circuit 33 from an output from the first amplifier circuit 31. The output from the first DA converter circuit 33 is amplified by a gain of 0.8. The method for amplification by a gain of 0.8 in a system comprising the first AD converter circuit 32 and the first DA converter circuit 33 was described in the first embodiment. A second amplifier circuit 35 amplifies an output from the first subtracter circuit 34 by a gain of 2.5. A first subtracting amplifier circuit 36 of an integral type may be used instead of the first subtracter circuit 34 and the second amplifier circuit 35. In this way, the circuit is simplified.

A description will now be given of the subsequent stage. A first switch SW31 and a second switch SW32 are alternately turned on and off. The analog signal input from the preceding stage via the first switch SW31 when the first switch SW31 is turned on and the second switch SW32 is turned off is fed to a third amplifier circuit 37 and a second AD converter circuit 38. The second AD converter circuit 3048 is also of a flash type and the resolution thereof, i.e. the number of bits including the redundant 1 bit, is 3 bits. The second AD converter circuit 38 converts the input analog signal into a digital value, retrieves the 5th through 6th highest bits (D5–D4) and outputs the bits to the encoder (not shown) and a second DA converter circuit 39.

Since the second stage is tasked with converting into 2 bits, the output from the first stage should practically be amplified by a gain of 4 (2 raised to the 2nd power). In the first stage, amplification by a gain of 2 is achieved by amplification by the first amplifier circuit 31 by a gain of 0.8 and amplification by the second amplifier circuit 35 by a gain of 2.5. In addition to this, by setting the reference voltage for the voltage comparators in the second AD converter circuit 38 to be ½ that of the first AD converter circuit 32, the aforementioned amplification by a gain of 4 is achieved.

The second DA converter circuit 39 converts the digital value produced by conversion by the second AD converter circuit 38 into an analog value. The third amplifier circuit 37 samples the input analog signal, amplifies the sampled signal by a gain of 2 and outputs the amplified signal to a second subtracter circuit 40. The second subtracter circuit 40 subtracts an output from the second DA converter circuit 39 from an output from the third amplifier circuit 37 and outputs the result to a fourth amplifier circuit 41. A description will now be given of a method of amplifying the output from the second DA converter 39 by a gain of 2. For amplification by a gain of 2.0, parameters controlled to achieve the amplification by a gain of 0.8 may be set accordingly. A second subtracting amplifier circuit 42 of an integral type may be used instead of the second subtracter circuit 40 and the fourth amplifier circuit 41.

The fourth amplifier circuit 41 amplifies an output from the second subtracter circuit 40 by a gain of 2. At this point of time, the first switch SW31 is turned off and the second switch SW32 has made a transition to an on state. The analog signal amplified by the fourth amplifier circuit 41 is fed back to the third amplifier circuit 37 and the second AD converter circuit 38 via the second switch SW32. The process described above is repeated so that the second AD converter circuit 38 retrieves the 7th through 8th highest bits (D3–D2) and the 9th through 10th highest bits (D1–D0). With this, a 10-bit digital value is obtained. The 5th through 10th highest bits are obtained by the subsequent stage of a cyclic type.

Figure 7:
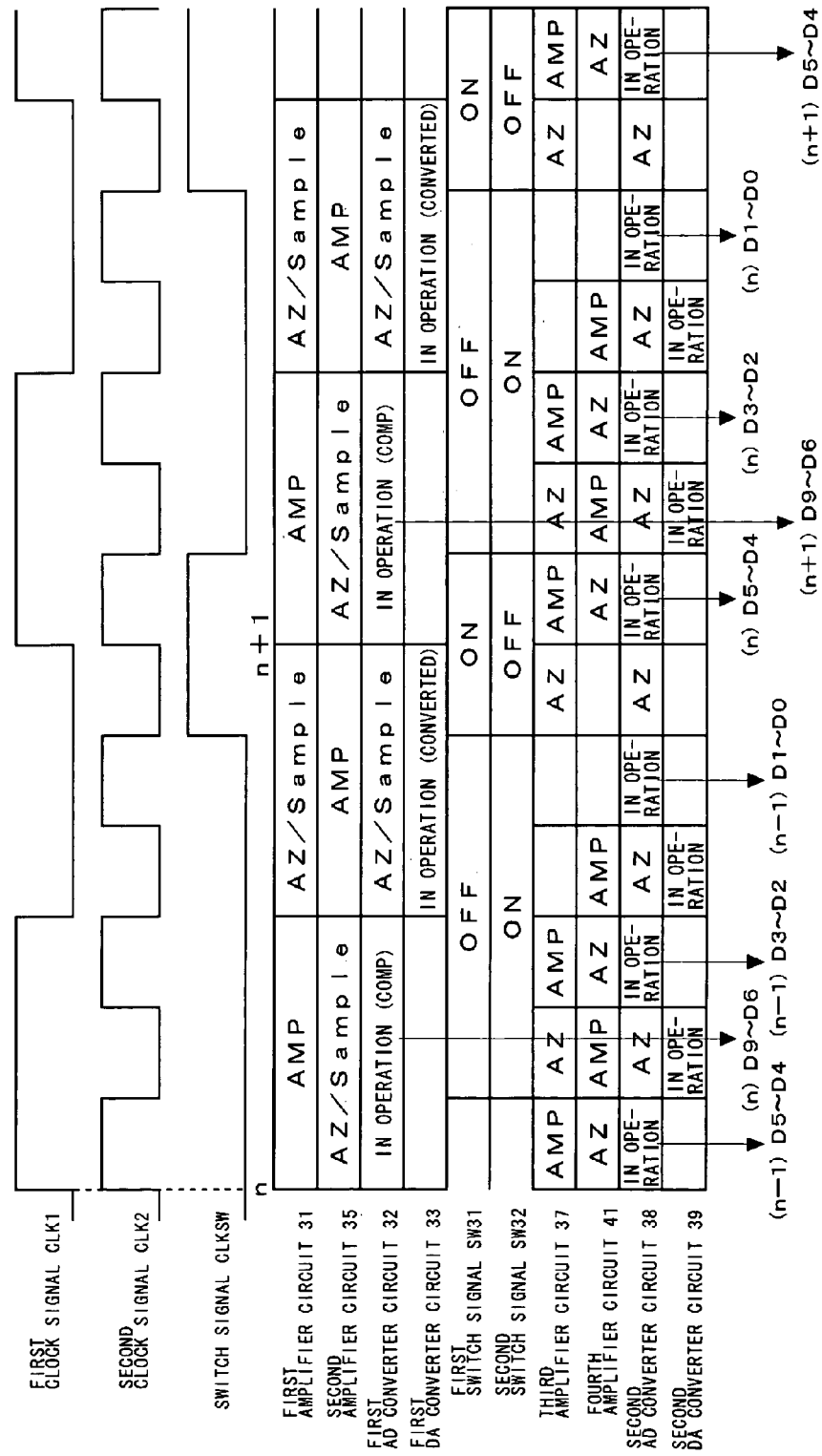
FIG. 7 is a time chart illustrating the operating process of the AD converter according to the second embodiment.

FIG. 7 is a timing chart illustrating the operating process of the AD converter according to the second embodiment. The process will be described from the first step downward in the figure. Three waveforms at the top are for a first clock signal CLK1, a second clock signal CLK2 and a switch signal CLKSW. The first clock signal CLK1 controls the operation of the first amplifier circuit 31, the second amplifier circuit 35, the first AD converter circuit 32 and the first DA converter circuit 33. The second clock signal CLK2 controls the operation of the third amplifier circuit 37, the fourth amplifier circuit 41, the second AD converter circuit 38 and the second DA converter circuit 39. The switch signal CLKSW effects on/off control of the first switch SW31 and the second switch SW32.

The frequency of the second clock signal CLK2 is three times that of the first clock signal CLK1. The second clock signal CLK2 may be generated by multiplying the first clock signal CLK1 using a PLL or the like. A rising edge of the second clock signal CLK2 is synchronized with a rising edge of the first clock signal CLK1. Subsequently, a third falling edge of the second clock signal CLK2 is synchronized with a second falling edge of the first clock signal CLK1. Further, a fourth rising edge of the second clock signal CLK2 is synchronized with a second rising edge of the first clock signal CLK1. Since the frequency of the second clock CLK2 is three times that of the first clock signal CLK1, the conversion speed in the subsequent stage is three times that of the conversion speed in the preceding stage. Analog processes such as subtraction and amplification for conversion into relatively higher bits largely affect overall precision in conversion. Therefore, higher precision is required of the preceding stage responsible for conversion into relatively higher bits. In this respect, it is possible to increase the speed of operation in the subsequent stage as compared to the preceding stage, since the requirement for precision in the subsequent stage is not as severe as that of the preceding stage.

The first amplifier circuit 31 and the first AD converter circuit 32 sample the input analog signal Vin at a rising edge of the first clock signal CLK1. The first amplifier circuit 31 amplifies the sampled analog signal by a gain of 0.8 when the first clock signal CLK1 is high and is placed in an autozero operation mode when the first clock signal CLK1 is low. The second amplifier circuit 35 samples the input analog signal at a falling edge of the first clock signal CLK1. When the first clock signal CLK1 is low, the second amplifier circuit 35 amplifies the sampled analog signal and outputs the amplified signal to the third amplifier circuit 37 and the second AD converter circuit 38. When the first clock signal CLK1 is high, the second amplifier circuit 35 is placed in an autozero operation mode. When the first subtracting amplifier circuit 36 is used instead of the second amplifier circuit 35, the first subtracting amplifier circuit 36 subjects the sampled signal to subtraction and amplification when the first clock signal CLK1 is low. The first AD converter circuit 32 converts into a digital value comprising the D9–D6 bits when the first clock signal CLK1 is high and is placed in an autozero operation mode when the first clock signal CLK1 is low. The first DA converter circuit 33 holds the converted data when the first clock signal CLK1 is low and is in an undefined state when the first clock signal CLK1 is high.

The first switch SW31 is turned on when the switch signal CLKSW is high and turned off when the switch signal CLKSW is low. The second switch SW32 is turned on when the switch signal CLKSW is low and turned off when the switch signal CLKSW is high.

The third amplifier circuit 37 and the second AD converter circuit 38 sample the input analog signal at a rising edge of the second clock signal CLK2. The third amplifier circuit 37 amplifies the sampled analog signal when the second clock signal CLK2 is high and is placed in an autozero operation mode when the second clock signal CLK2 is low. The third amplifier circuit 37 does not amplify while the second AD converter circuit 38 converts into the lowest bits D1–D0. The fourth amplifier circuit 41 samples the input analog signal at a falling edge of the second clock signal CLK2. The fourth amplifier circuit 41 amplifies the sampled analog signal when the second clock signal CLK2 is low and is placed in an autozero operation mode when the second clock signal CLK2 is high. When the second subtracting amplifier circuit 42 is used instead of the fourth amplifier circuit 41, the second subtracting amplifier circuit 42 subjects the sampled signal to subtraction and amplification when the second clock signal CLK2 is low. Amplification is not performed during the subsequent half-clock period after the second AD converter circuit 38 converted into the bits D1–D0.

When the second clock signal CLK2 is high, the second AD converter circuit 38 converts into 3 bits including a redundant bit. The second AD converter circuit 38 is placed in an autozero operation mode when the second clock signal CLK2 is low. The second DA converter circuit 39 holds the converted data when the second clock signal CLK2 is low and is in an undefined state when the second clock signal CLK2 is high. Conversion is not performed when the second AD converter circuit 38 outputs the bits D1–D0.

In an autozero period, the first amplifier circuit 31, the second amplifier circuit 35, the third amplifier circuit 37, the fourth amplifier circuit 41, the first AD converter circuit 32 and the second AD converter circuit 38 are operating to sample the input signal. As shown, while the second AD converter circuit 38 is converting into D5, D4 and D3, D2, the first AD converter circuit 32 is converting from a subsequently input analog signal Vin concurrently. According to the pipeline process as described above, the AD converter as a whole is capable of outputting a digital value of 10 bits once in a cycle defined by the first clock signal CLK1. By setting the reference voltage for the voltage comparators in the first AD converter circuit 32 to be 2.5 times that of the second AD converter circuit 38, the gain of the second amplifier circuit 35 can be set to 2.

By setting the gain of the first amplifier circuit 31 with the severest requirement for precision to be below 1, distortion in the output analog signal from the first amplifier circuit 31 is removed so that the characteristics of the AD converter as a whole are improved.

Third Embodiment

The third embodiment provides an AD converter of a cyclic type which converts into 4 bits initially and subsequently converts into 2 bits in each of 3 cycles, thus outputting a total of 10 bits.

Figure 8:
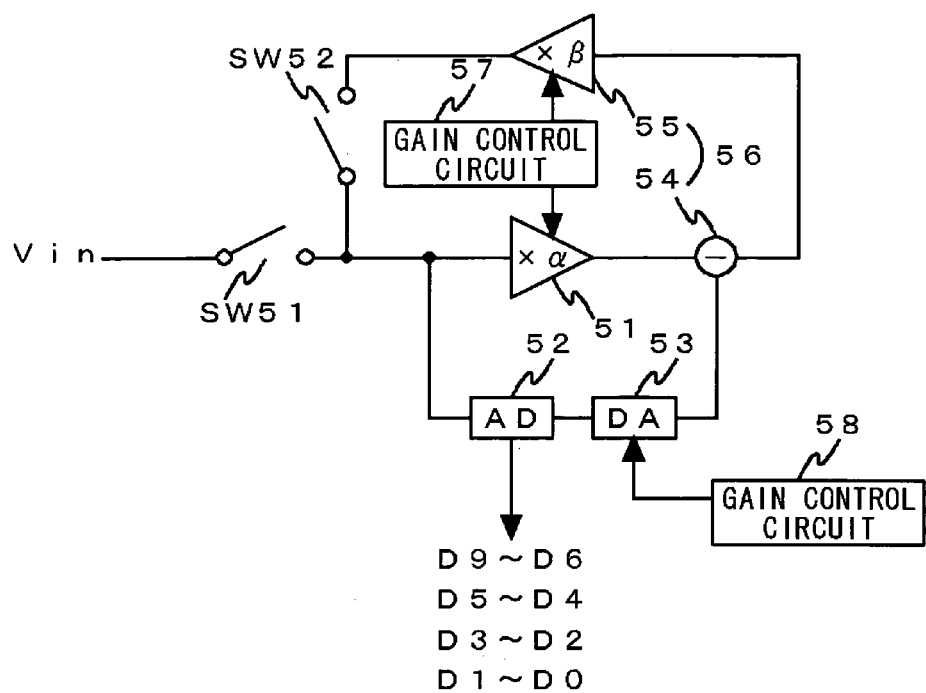
FIG. 8 illustrates the structure of an AD converter according to a third embodiment of the present invention.

FIG. 8 illustrates the structure of an AD converter according to the third embodiment. A first switch SW51 and a second switch SW52 are alternately turned on and off. In an initial state, the first switch SW51 is turned on and the second switch SW52 is turned off. The input analog signal Vin is fed to a first amplifier circuit 51 and an AD converter circuit 52 via the first switch SW51. The first amplifier circuit 51 amplifies the input analog signal by a gain of 0.8 and outputs the amplified signal to a subtracter circuit 54. The first AD converter circuit 4012 is of a flash type and the maximum resolution thereof, i.e. the number of bits produced by conversion therein, is 4 bits. The AD converter circuit 52 converts the analog signal input via the first switch SW51 into a digital value, retrieves the higher 4 bits (D9–D6) and outputs the bits to the encoder (not shown) and a DA converter circuit 53. The DA converter circuit 53 converts the digital value produced by conversion by the AD converter circuit 52 into an analog value.

The subtracter circuit 54 subtracts an output from the first DA converter circuit 53 from an output from the first amplifier circuit 51. The output from the DA converter circuit 53 is practically amplified by a gain of 0.8. For this purpose, the same method as used in the first embodiment may be used. A second amplifier circuit 55 amplifies an output from the subtracter circuit 54 by a gain of 5. A subtracting amplifier circuit 56 of an integral type may be used instead of the subtracter circuit 54 and the second amplifier circuit 55. In this way, the circuit is simplified.

At this point of time, the first switch SW51 is turned off and the second switch SW52 has made a transition to an on state. In association with this, a first gain control circuit 57 switches the gain of the first amplifier circuit 51 from 0.8 to 2 and switches the gain of the second amplifier circuit 55 from 5 to 2. Given that the first amplifier circuit 51 and the second amplifier circuit 55 are configured to include a switched capacitor, the above-mentioned switching is effected by switching between the capacitance values of the capacitor connected to the feedback system. A second gain control circuit 58 switches the gain for amplification of the output from the AD converter circuit 52 by the DA converter circuit 53 from 0.8 to 2. As described above, given that the DA converter circuit 53 is configured to include a capacitor array, the circuit structure for amplifying the output from the AD converter circuit 52 by a gain of 0.8 and the circuit structure for amplification by a factor of 2 are built by adjusting the number of capacitors, the capacitance thereof and/or the reference voltage range. By enabling switching between these circuit structures by on/off control of switches, switching between different gains is easily achieved.

The analog signal output from the second amplifier circuit 55 is fed back to the first amplifier circuit 51 and the AD converter circuit 52 via the second switch SW52. The first amplifier circuit 51 amplifies the input analog signal by a gain of 2 and outputs the amplified signal to the subtracter circuit 54. The AD converter circuit 52 converts the analog signal input via the second switch SW52 into 2 bits excluding the redundant 1 bit, retrieves the 5th through 6th highest bits (D5–D4) and outputs the bits to the encoder (not shown) and the DA converter circuit 53. The DA converter circuit 53 converts the digital value produced by conversion by the AD converter circuit 52 into an analog value. The subtracter circuit 54 subtracts an ouptut from the DA converter circuit 53 from an output from the first amplifier circuit 51. The output from the DA converter circuit 53 is practically amplified by a gain of 2. The second amplifier circuit 55 amplifies an output from the subtracter circuit 54 by a gain of 2. The process described above is repeated so that the AD converter circuit 52 retrieves the 7th through 8th highest bits (D3–D2) and the 9th through 10th highest bits (D1–D0). With this, a 10-bit digital value is obtained.

By setting the gain of the first amplifier circuit 51 in the first cycle with the severest requirement for precision to be below 1, and by setting the gain of the first amplifier circuit 51 in the second and subsequent cycles to be above 1, both the requirement for precision and the requirement for speed are met. More specifically, by setting the gain of the first amplifier circuit 51 in the second and subsequent cycles to be above 1, the gain of the second amplifier circuit 55 can be lowered. With this, the settling time of both the first amplifier circuit 51 and the second amplifier circuit 55 is reduced so that the operating speed of the second and subsequent cycles is increased.

Fourth Embodiment

In the fourth embodiment, a circuit for determining the signal level of the analog signal Vin input to the AD converter of a pipeline type or a cyclic type is added.

Figure 9:
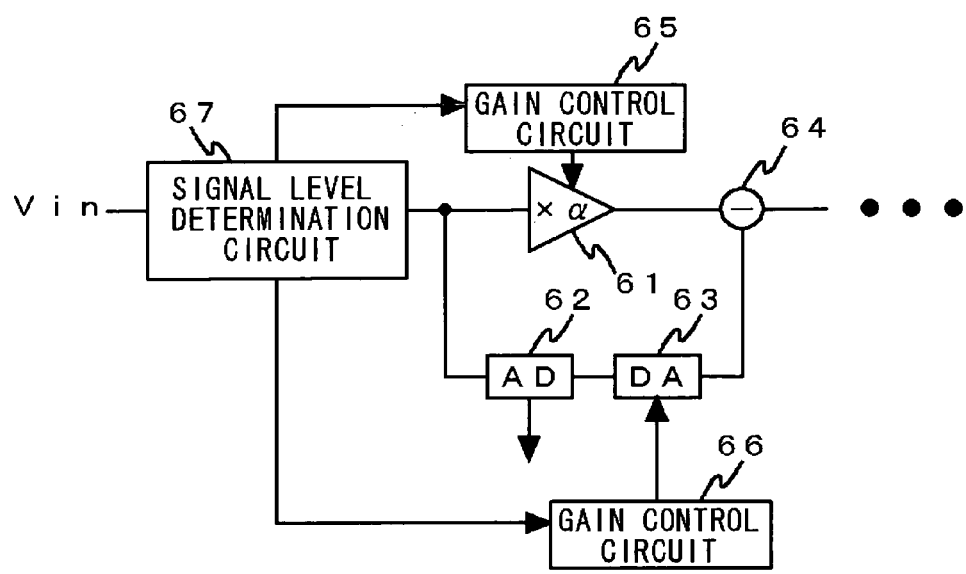
FIG. 9 illustrates a part of the structure of an AD converter according to a fourth embodiment of the present invention.

FIG. 9 illustrates a part of the structure of an AD converter according to the fourth embodiment of the present invention. The input analog signal Vin is fed to a signal level determination circuit 67 before being fed to an amplifier circuit 61 and an AD converter circuit 62. The signal level determination circuit 67 compares the input analog signal Vin with a predetermined threshold value. The predetermined threshold value is for determination as to whether the input analog signal Vin is at a level that causes distortion when being input to the amplifier circuit 61.

When the level exceeds the predetermined threshold level, the signal level determination circuit 67 directs a first gain control circuit 65 and a second gain control circuit 66 to select amode for a gain of below 1. For example, amode for amplification by a gain of 0.8 is designated. When the level is equal to or below the predetermined threshold level, the signal level determination circuit 67 directs the first gain control circuit 65 and the second gain control circuit 66 to select a mode for amplification by a gain of 1 or larger. For example, a mode for amplification by a gain of 1.0 or 2.0 is designated. The first gain control circuit 65 controls the gain of the amplifier circuit 61 in accordance with an instruction from the signal level determination circuit 67. The second gain control circuit 66 controls the gain for amplification of the output from the AD converter circuit 65 by the DA converter circuit 63, in accordance with an instruction from the signal level determination circuit 67. The circuit structure of the fourth embodiment may be used in combination with the first through third embodiments. In the combinations, the signal level determination circuit 67 is connected to precede the first amplifier circuits 11, 31 and 51 of the first through third embodiments, respectively.

By switchably using different gains of the amplifier circuit in the first stage in accordance with the level of the input analog signal Vin, both precision and speed are achieved in a compatible manner. More specifically, when the signal is at a level that produces an output within an output voltage range of the amplifier circuit, it is not necessary to amplify by a gain below 1. In that case, amplification by a gain below 1 is not performed. With this, the gain of an amplifier circuit subsequent to the amplifier circuit for amplification by a gain above 1 can be lowered so that the operating speed is increased.

Described above is an explanation based on the embodiments. The description of the embodiments is illustrative in nature and various variations in constituting elements and processes involved are possible. Those skilled in the art would readily appreciate that the variations are also within the scope of the present invention.

In the first embodiment, the third amplifier circuit 17 or the fifth amplifier circuit 23 may be removed. By adjusting the timing schedule for sampling of the input analog signal by the second subtracting amplifier circuit 22 or the third subtracting amplifier circuit 28, or by switching between different timing schedules for input of the analog signal Vin and the reference voltage to the voltage comparators constituting the second AD converter circuit 18 or the third AD converter circuit 24, the operation of the AD converter as a whole is ensured even if the third amplifier circuit 17 or the fifth amplifier circuit 23 is removed. In that case, the gain of the second subtracting amplifier circuit 22 or the third subtracting amplifier circuit 28 may be set to 4.0. In this way, the circuit area is reduced.

Parameters such as the number of bits produced as a result of conversion by the AD converter circuit, allocation of conversion bits, the gain of the amplifier circuits, the number of voltage comparators in the AD converter circuit of a flash type, the number of capacitors in the DA converter circuit of a capacitor array type, the capacitance of the capacitors, the resistance of the resistor for stepping down the higher reference voltage VRT are merely by way of examples. Other parameter values may also be employed in the variations. Also, the number of stages in the AD converter of a pipeline type may arbitrary set. An arbitrary stage of the AD converter of a pipeline type may be configured as a cyclic type.

Although the present invention has been described by way of exemplary embodiments, it should be understood again that many other changes and substitutions may still further be made by those skilled in the art without departing from the scope of the present invention which is defined by the appended claims.

What is claimed is:

1. An analog-digital converter comprising a basic unit for each of the converter's stages, said basic unit comprising:
   an analog-digital converter circuit converting an analog signal input to the unit's stage into a digital value of a predetermined number of bits;
   a digital-analog converter circuit converting an output from the analog-digital converter into an analog signal;
   a subtracter circuit subtracting an output from the digital-analog circuit from the analog signal input to the unit's stage or from an output analog signal from an amplifier amplifying the analog signal input to the unit's stage by a predetermined gain, wherein a target digital signal from the analog-digital converter is obtained by using the basic unit once or in repeated sequences, and a gain of at least one amplifier circuit included in the analog-digital converter is set to be below 1.

2. An analog-digital converter converting an input analog signal into a digital signal in a plurality of discrete steps and comprising stages each of which comprises:
   an amplifier circuit amplifying an analog signal input to the amplifier's stage by a gain below 1;
   an analog-digital converter circuit parallel with the amplifier circuit to receive the analog signal and convert a component of the analog signal into a digital value of a predetermined number of bits;
   a digital-analog converter circuit converting an output from the analog-digital circuit into an analog signal; and
   a subtracter circuit subtracting an output from the digital-analog circuit from an output from the amplifier circuit.

3. The analog-digital converter according to claim 1, wherein the amplifier circuit amplifying by a gain below 1 is an amplifier circuit which first receives the analog signal input to the analog-digital converter.

4. The analog-digital converter according to claim 2, wherein the amplifier circuit amplifying by a gain below 1 is an amplifier circuit which first receives the analog signal input to the analog-digital converter.

5. The analog-digital converter according to claim 1, further comprising a feedback stage which feeds an output analog signal from the feedback stage back to an input of the feedback stage.

6. The analog-digital converter according to claim 2, further comprising a feedback stage which feeds an output analog signal from the feedback stage back to an input of the feedback stage.

7. The analog-digital converter according to claim 1, wherein the digital-analog converter circuit amplifies by a gain practically identical with the gain of a corresponding amplifier circuit before outputting an analog signal from conversion.

8. The analog-digital converter according to claim 2, wherein the digital-analog converter circuit amplifies by a gain practically identical with the gain of a corresponding amplifier circuit before outputting an analog signal from conversion.

9. The analog-digital converter according to claim 7, wherein the digital-analog converter circuit is configured to include a capacitor array, and the number of capacitors is adjusted in accordance with the gain to be achieved.

10. The analog-digital converter according to claim 8, wherein the digital-analog converter circuit is configured to include a capacitor array, and the number of capacitors is adjusted in accordance with the gain to be achieved.

11. The analog-digital converter according to claim 7, further comprising:
    a gain control circuit controlling the gain of the amplifier circuit which receives the analog signal input to the circuit's stage and the gain of the DA converter circuit in the same stage, wherein when a difference between an output from the amplifier circuit and an output from the DA converter circuit is amplified by a predetermined gain and fed back to the amplifier circuit and the analog-digital converter circuit, the gain control circuit sets the gain of the amplifier circuit and the gain of the DA converter circuit to be 1 or larger.

12. The analog-digital converter according to claim 8, further comprising:
    a gain control circuit controlling the gain of the amplifier circuit which receives the analog signal input to the circuit's stage and the gain of the DA converter circuit in the same stage, wherein when a difference between an output from the amplifier circuit and an output from the DA converter circuit is amplified by a predetermined gain and fed back to the amplifier circuit and the analog-digital converter circuit, the gain control circuit sets the gain of the amplifier circuit and the gain of the DA converter circuit to be 1 or larger.

13. The analog-digital converter according to claim 9, further comprising:
    a gain control circuit controlling the gain of the amplifier circuit which receives the analog signal input to the circuit's stage and the gain of the DA converter circuit in the same stage, wherein when a difference between an output from the amplifier circuit and an output from the DA converter circuit is amplified by a predetermined gain and fed back to the amplifier circuit and the analog-digital converter circuit, the gain control circuit sets the gain of the amplifier circuit and the gain of the DA converter circuit to be 1 or larger.

14. The analog-digital converter according to claim 10, further comprising:
    a gain control circuit controlling the gain of the amplifier circuit which receives the analog signal input to the circuit's stage and the gain of the DA converter circuit in the same stage, wherein when a difference between an output from the amplifier circuit and an output from the DA converter circuit is amplified by a predetermined gain and fed back to the amplifier circuit and the analog-digital converter circuit, the gain control circuit sets the gain of the amplifier circuit and the gain of the DA converter circuit to be 1 or larger.

15. The analog-digital converter according to claim 7, further comprising:
    a signal level determination circuit determining the level of an analog signal input to an amplifier circuit which receives an analog signal input to the signal level determination circuit's stage; and
    a gain control circuit setting the gain of the amplifier circuit and the gain of the digital-analog converter circuit of the same stage to be 1 or larger when the signal level determination circuit determines that the analog signal is equal to or below a predetermined threshold level.

16. The analog-digital converter according to claim 8, further comprising:
    a signal level determination circuit determining the level of an analog signal input to an amplifier circuit which receives an analog signal input to the signal level determination circuit's stage; and
    a gain control circuit setting the gain of the amplifier circuit and the gain of the digital-analog converter circuit of the same stage to be 1 or larger when the signal level determination circuit determines that the analog signal is equal to or below a predetermined threshold level.

17. The analog-digital converter according to claim 9, further comprising:
   a signal level determination circuit determining the level of an analog signal input to an amplifier circuit which receives an analog signal input to the signal level determination circuit's stage; and
   a gain control circuit setting the gain of the amplifier circuit and the gain of the digital-analog converter circuit of the same stage to be 1 or larger when the signal level determination circuit determines that the analog signal is equal to or below a predetermined threshold level.

18. The analog-digital converter according to claim 10, further comprising:
   a signal level determination circuit determining the level of an analog signal input to an amplifier circuit which receives an analog signal input to the signal level determination circuit's stage; and
   a gain control circuit setting the gain of the amplifier circuit and the gain of the digital-analog converter circuit of the same stage to be 1 or larger when the signal level determination circuit determines that the analog signal is equal to or below a predetermined threshold level.

19. The analog-digital converter according to claim 1, wherein the amplifier circuit comprises an operational amplifier.

20. The analog-digital converter according to claim 2, wherein the amplifier circuit comprises an operational amplifier.

* * * * *